United States Patent
Van Eijk et al.

(10) Patent No.: US 8,482,719 B2
(45) Date of Patent: Jul. 9, 2013

(54) POSITIONING SYSTEM, LITHOGRAPHIC APPARATUS AND METHOD

(75) Inventors: Jan Van Eijk, Eindhoven (NL); Engelbertus Antonius Fransiscus Van Der Pasch, Oirschot (NL); Johannes Petrus Martinus Bernardus Vermeulen, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 418 days.

(21) Appl. No.: 12/830,963

(22) Filed: Jul. 6, 2010

(65) Prior Publication Data

US 2011/0026004 A1 Feb. 3, 2011

Related U.S. Application Data

(60) Provisional application No. 61/230,501, filed on Jul. 31, 2009.

(51) Int. Cl.
G03B 27/58 (2006.01)
G03B 27/32 (2006.01)
G03B 27/62 (2006.01)
G03B 27/42 (2006.01)

(52) U.S. Cl.
USPC .......................................................... 355/72

(58) Field of Classification Search
USPC .............. 355/52, 53, 55, 67, 72–77; 356/614, 356/623, 625–640; 250/442.11, 492.2, 492.22, 250/548; 414/489
See application file for complete search history.

(56) References Cited

U.S. PATENT DOCUMENTS

| 5,894,056 A | * | 4/1999 | Kakizaki et al. ................... 430/5 |
| 5,900,707 A | * | 5/1999 | Wakui ............................ 318/625 |
| 6,023,325 A | * | 2/2000 | Sahlgren et al. ............. 356/73.1 |

(Continued)

FOREIGN PATENT DOCUMENTS

| JP | 2001-358058 | 12/2001 |
| JP | 2003-256050 | 9/2003 |

(Continued)

OTHER PUBLICATIONS

Office Action in related Korean patent application No. 10-2010-0073450 mailed Jul. 30, 2011.

(Continued)

*Primary Examiner* — Toan Ton
*Assistant Examiner* — Christina Riddle
(74) *Attorney, Agent, or Firm* — Pillsbury Winthrop Shaw Pittman LLP

(57) ABSTRACT

A positioning system to position a movable object having a body, the positioning system includes an object position measurement system, an object actuator, and an object controller, wherein the positioning system further includes a stiffener to increase the stiffness and/or to damp relative movements within the body of the object, the stiffener including; one or more sensors, wherein each sensor is arranged to determine a measurement signal representative of an internal strain or relative displacement in the body, one or more actuators, wherein each actuator is arranged to exert an actuation force on a part of the body, and at least one controller, configured to provide on the basis of the measurement signal of at least one of the sensors, an actuation signal to at least one of the actuators to increase the stiffness and/or to damp movements within the body.

16 Claims, 7 Drawing Sheets

U.S. PATENT DOCUMENTS

| | | | |
|---|---|---|---|
| 6,330,052 B1 * | 12/2001 | Yonekawa et al. | 355/53 |
| 6,359,688 B2 * | 3/2002 | Akimoto et al. | 356/401 |
| 6,881,963 B2 * | 4/2005 | Ito | 250/491.1 |
| 7,133,115 B2 * | 11/2006 | Nawata et al. | 355/53 |
| 7,902,494 B2 * | 3/2011 | Klaver et al. | 250/237 G |
| 2003/0090645 A1 * | 5/2003 | Kato | 355/72 |
| 2003/0146554 A1 * | 8/2003 | Kato | 267/136 |
| 2008/0246936 A1 | 10/2008 | Loopstra et al. | |
| 2011/0128553 A1 * | 6/2011 | Nakanishi | 356/614 |

FOREIGN PATENT DOCUMENTS

| | | |
|---|---|---|
| JP | 2004-164029 | 6/2004 |
| JP | 2007-184621 | 7/2007 |
| JP | 2008-258613 | 10/2008 |

OTHER PUBLICATIONS

Japanese Office Action mailed Feb. 28, 2012 in corresponding Japanese Patent Application No. 2010-165421.

* cited by examiner

POSITIONING SYSTEM, LITHOGRAPHIC APPARATUS AND METHOD

CROSS REFERENCE TO RELATED APPLICATIONS

This application claims priority and benefit under 35 U.S.C. §119(e) to U.S. Provisional Patent Application No. 61/230,501, entitled "Positioning System, Lithographic Apparatus and Method", filed on Jul. 31, 2009. The content of that application is incorporated herein in its entirety by reference.

FIELD

The present invention relates to a positioning system, a lithographic apparatus and a method to reduce flexibility and resulting internal deformations by increasing stiffness and/or damping of a body of an object.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The known lithographic apparatus includes a positioning device to control the position of a substrate support supporting the substrate. This positioning device includes a position measurement system which is configured to measure a number of sensors or sensor target positions of the substrate support.

During use of the lithographic apparatus, forces will be exerted on the substrate support. For instance, during the expose phase, i.e. during projection of the patterned beam on a target portion of the substrate level, level actuations may be performed to position the upper surface of the substrate in a correct orientation with respect to the lens column. As the stiffness of the substrate support is limited, the level actuations may cause temporary internal deformations of the substrate support. Such internal deformations may lead to focus errors and/or offset in overlay.

To reduce the risk of internal deformations of the substrate table and as a consequence focus errors or overlay offset, it has been proposed to increase the stiffness of the substrate support by providing a stiffer structure. However, due to the increasing demand on accuracy and speed of the positioning of the substrate support, the possibilities to increase the structural stiffness of the substrate support structure without encountering further problems, for instance with respect to weight have come to their limits.

These limitations in flexibility of the substrate support as a result of increasing accelerations are also encountered in the position control of other objects such as the patterning device support.

SUMMARY

It is desirable to provide a positioning system to position a movable object, in particular a substrate table or patterning device support, wherein the body of the movable object is stiff so that internal deformations of the body and consequent focus errors and/or offset in overlay can be avoided, or at least decreased.

According to an embodiment of the invention, there is provided a positioning system to position a movable object having a body, the positioning system including: an object position measurement system to measure a position quantity of the object, an object actuator to exert an actuation force on the object, and an object controller to provide an object actuation signal for the actuator on the basis of a difference between a desired position quantity and the measured position quantity, wherein the positioning system further includes a stiffening system to increase the stiffness and/or to damp relative movements within the body of the object, the stiffening system including one or more sensors, wherein each sensor is arranged to determine a measurement signal representative of an internal strain or relative displacement in the body, one or more actuators, wherein each actuator is arranged to exert an actuation force on a part of the body, and at least one controller, configured to provide on the basis of the measurement signal of at least one of the sensors, an actuation signal to at least one of the actuators to increase the stiffness and/or to damp movements within the body.

According to an embodiment of the invention, there is provided a lithographic apparatus including: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the lithographic apparatus includes a positioning system to control a position of the support or substrate table, the support or substrate table having a body, the positioning system including: a body position measurement system to measure a position quantity of the body of the support or substrate table, a body actuator to exert an actuation force on the body of the support or substrate table, and a body controller to provide an actuation signal for the actuator on the basis of a difference between a desired position quantity and the measured position quantity, wherein the positioning system further includes a stiffening system to increase the stiffness and/or to damp relative movements within the body of the object, the stiffening system including: one or more sensors, wherein each sensor is arranged to determine a measurement signal representative of an internal strain or relative displacement in the body, one or more actuators, wherein each actuator is arranged to exert an actuation force on a part of the body, and at least one controller, configured to provide on the basis of the measurement signal of at least one of the sensors, an actuation signal to at least one of the actuators to increase the stiffness and/or to damp movements within the body.

According to an embodiment of the invention, there is provided a method to reduce flexibility and resulting internal deformations by the increase of stiffness and/or damping movements within a body of an object, including: providing a stiffening system including: one or more sensors, wherein each sensor is arranged to measure a measurement signal representative of an internal strain or relative displacement in the body, wherein one or more actuators, wherein each actuator is arranged to exert an actuation force on a part of the body, and at least one controller, configured to provide on the basis of the measurement signal of at least one of the sensors, an actuation signal to at least one of the actuators to increase the stiffness and/or to damp movements within the body, measuring with at least one sensor a distance between two parts of the body to obtain the measurement signal, providing an actuation signal for one or more of the actuators to maintain the distance at a zero level, feeding the actuation signal to the one or more of the actuators to exert a force on at least one part of the body.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
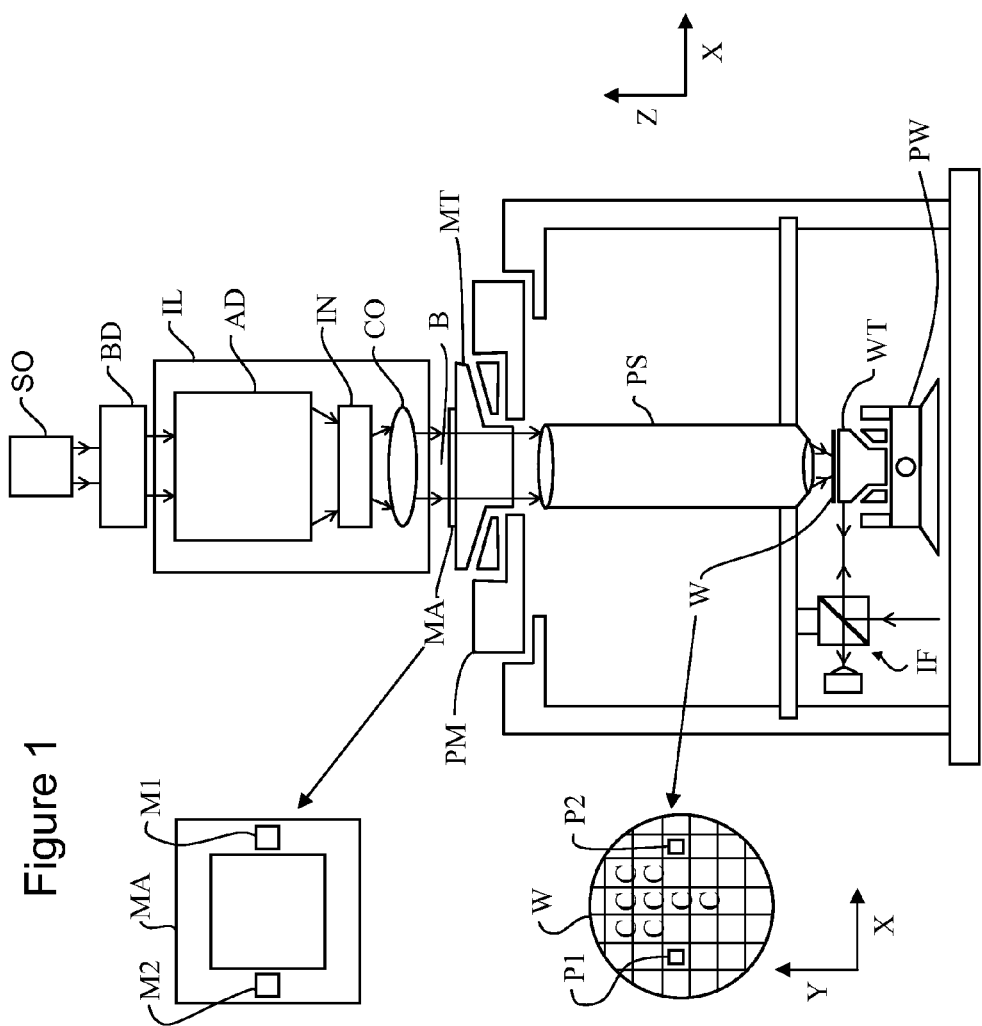
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or mask support structure (e.g. a mask table) MT constructed to support a patterning device (e.g. a mask) MA and connected to a first positioning device 1M configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
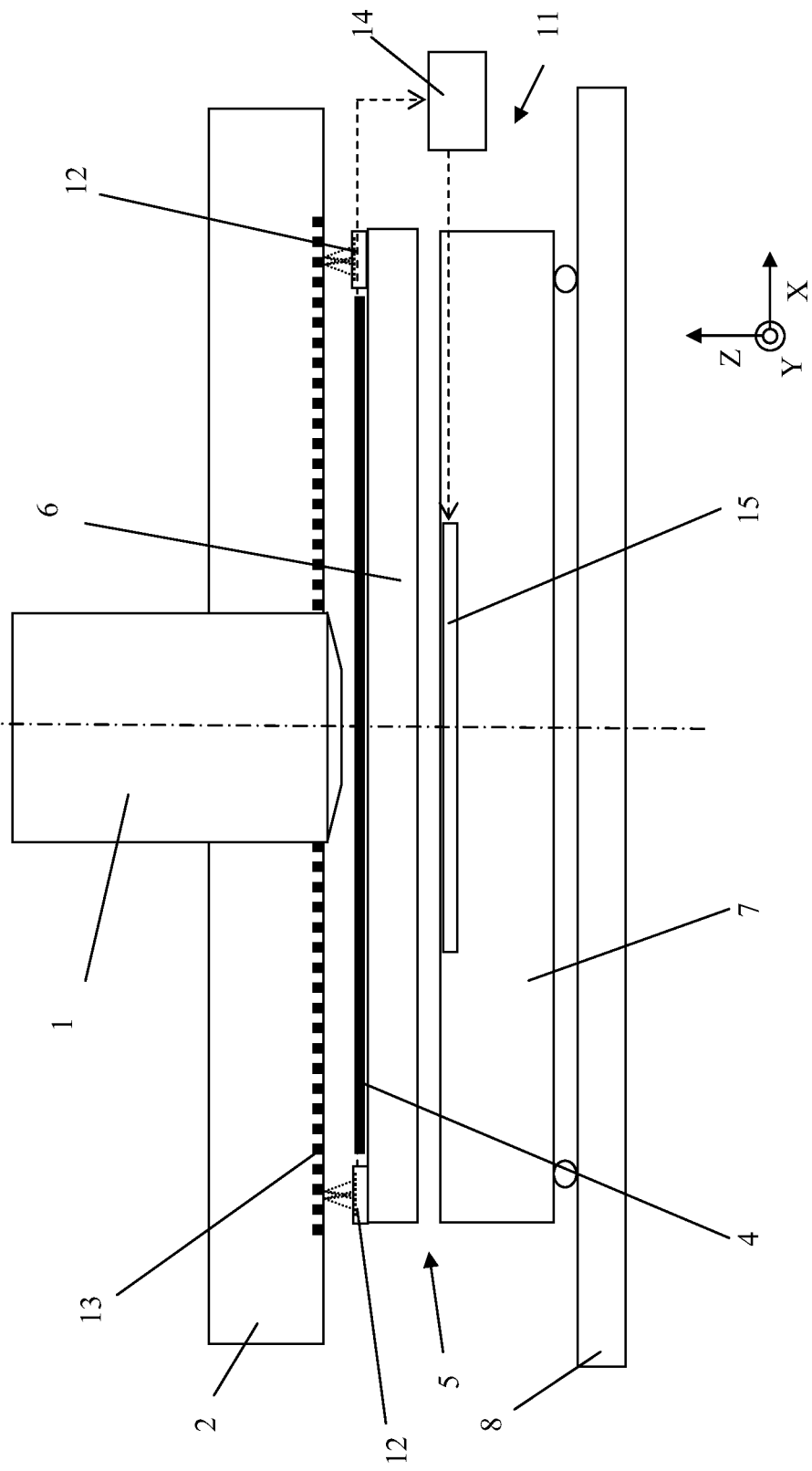
FIG. 2 depicts a conventional rigid body positioning system for a substrate table.

FIG. 2 shows a part of a conventional lithographic apparatus in more detail. A projection system 1 is mounted on a metro frame 2. The projection system 1 is configured to project a patterned beam of radiation on a substrate 4 supported on a substrate support 5. The substrate support 5 includes a substrate table 6, also referred to as short stroke stage, and a substrate table support 7, also referred to as long stroke stage, arranged to support the substrate table 6.

The substrate table support 7 is movably mounted on base frame 8. The substrate table support 7 is movable with respect to the base frame 8 over a relative long range in at least two directions (X,Y). The substrate table 6 is in its turn movable with respect to the substrate table support 7 over a relative small range.

A positioning system 11 is provided to align a target portion of the substrate 4 with respect to the projection system 1. The positioning system includes a substrate table position measurement system or sensor including encoder heads 12 mounted on the substrate table 6, and a grid or grating 13 arranged on the metro frame 2. Preferably, at least three encoder heads 12 are provided, each capable of measuring a position in two directions, therewith providing at least six degrees of freedom (DOF) position information of the substrate table 6.

The grid or grating 13 is for instance provided on a grid plate mounted on the metro frame 2. The positioning system further includes a controller 14 to provide an actuator signal to a substrate table actuator 15 arranged to position the substrate table 6 very accurately in a desired position, preferably in six degrees of freedom (DOF).

Since the substrate table 6 can only be moved over a relative small range with respect to the substrate table support 7, the positioning system actuates the substrate table support 7 to follow the movement of the substrate table so that the required movement of the substrate table 7 remains within the relative small range of the movement of the substrate table 6 with respect to the substrate table support 7. In this small range the substrate table 6 can be controlled with high accuracy.

Each of the encoder heads 12 provides a measurement signal which is representative of a position or change in position of the encoder heads 12 with respect to the grid or grating 13. The controller includes a subtractor in which the measured position is subtracted from a desired position signal generated by a set point generator. The resulting error signal is fed to a control device of the controller 14 which generates an actuation signal on the basis of the error signal. This actuation signal is fed to the substrate table actuator to move the actuator to the desired position. Feed-forward loops may be added in the control of the position of the substrate table 6 to further improve the accuracy and response time of the control system.

The above described positioning system is a conventional positioning system. In the position control it is assumed that the substrate table behaves as a rigid body, having no internal deformation during acceleration of the body. However, with increasing demands on throughput and accuracy of the lithographic, the acceleration and deceleration of the substrate table 6 during positioning are generally increased. As a result, internal deformation of the substrate table 6 during movements, in particular acceleration and deceleration, play an increasing role in the accuracy of the positioning of a substrate table 6. Therefore, in the relevant frequency range, the substrate table 6 can no longer be regarded as a rigid body.

Figure 3:
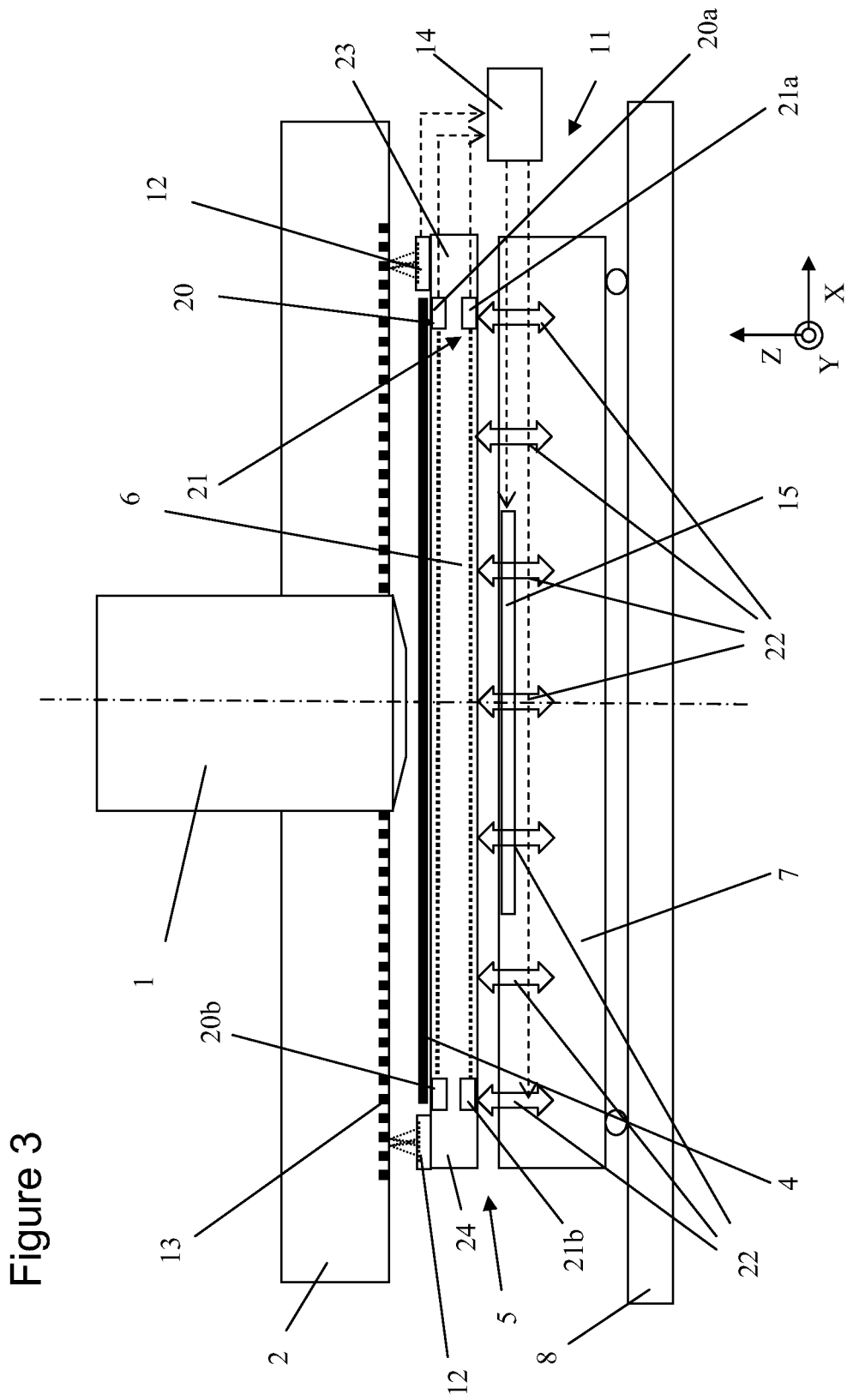
FIG. 3 depicts a positioning system for a substrate table according to an embodiment of the invention.

FIG. 3 shows a positioning system according to an embodiment of the invention. Unless otherwise described the positioning system of FIG. 3 is similar to the positioning system of FIG. 2, and the parts of the system are indicated with the same reference numerals.

The positioning system includes a rigid body control system or controller including encoder heads 12, grid or grating 13, controller 14 and actuator 15. Next to the rigid body control system, the positioning system of FIG. 3 includes a stiffening system or stiffener, which is configured to actively increase the stiffness and/or damp relative movements within the substrate table 6.

The stiffening system or stiffener includes sensors 20, 21 and actuators 22. The stiffener further includes a control unit which is integrated in the controller 14. In an alternative embodiment, the control unit of the stiffener may be a separate control unit. The actuators 22 may be of any suitable type, for instance Lorentz type actuators. The actuators 22 are divided over the surface of the substrate table 6, and arranged to exert a force on the substrate table 6 in the z-direction as indicated by the double-headed arrows representing the actuators 22. To provide sufficient locations for exerting an actuation force on the substrate table 6 multiple actuators 22, for instance ten to twenty, may be divided over the surface of the substrate table 6. However, in an embodiment it may also be possible to provide only one sensor and one actuator, for instance to counteract one specific internal deformation mode of the substrate table 6.

The sensors 20, 21 include a laser source and detector unit 20a, 21a and a mirror unit 20b, 21b. A laser source in the laser source and detector unit emits a radiation or laser beam towards the mirror unit 20b, 21b which reflects the beam towards a detector in the laser source and detector unit 20a. The detector provides a signal which is compared with a signal provided by a reference beam which only travels within the laser source and detector unit between the source and a reference detector. In this measurement system in which use is made of laser interferometry, a change in distance between different parts of the substrate table 6 may be determined.

Any other sensor configuration in particular using an optical measurement system, such as laser interferometry, to determine a change in distance in the substrate table 6, may also be used. As an alternative, high performance strain gauges, i.e. strain gauges capable of measuring very small changes in distance in a short time, may also be applied.

In an embodiment, the laser source and detectors of the sensors 20 may be arranged in the substrate table support 7 so that all parts which require cabling are not mounted in the substrate table 6. The measurement beams in the substrate table 6 may be guided by mirrors along the desired measurement path to the respective detectors. The location of the laser source and detectors in the substrate table support 7 may have a positive influence on the movability and the weight of the substrate table 6.

In the embodiment shown in FIG. 3, the substrate table 6 is made of light-transparent material, for instance glass, through which the measurement beams may travel. In another embodiment, the measurement sensor may be mounted on the outside of the substrate table so that the measurement beams may travel along the side of the substrate table, or spaces, for instance channels, such as drilled holes, may be provided in the substrate table 6 for passage of the measurement beams. The benefit of a light-transparent body through which the measurement beams travel is that there are no or less influences of changing atmosphere on the measurement beams.

The sensors 20, 21 are arranged to measure a change in distance between two ends 23, 24 of the substrate table 6. In the shown embodiment a first sensor 20 is arranged to measure a length between one end 23 and the opposed end 24 of the substrate table 6 at the upper side of the substrate table 6, while the second sensor 21 is arranged to measure a length between one end 23 and the opposed end 24 of the substrate table 6 at the lower side of the substrate table 6. Both sensors 20, 21 measure a distance which remains constant when there are no internal deformations in the substrate table 6. Measurement of a change in distance between the two ends 23, 24 of the substrate table 6 provides a measurement signal which is representative of an internal deformation in the substrate table 6.

The measurement signal is fed to the controller 14. The controller 14 provides actuation signals to one or more of the actuators 22 to exert a force on the substrate table 6 to counteract the change in distance between the two ends 23, 24 of the substrate table 6, and therewith the internal deformation of the substrate table.

The control action of the stiffener is aimed at keeping the change in distance measured between the two ends 23 and 24 at substantially zero. As a result, the stiffness of the substrate table 6 is significantly increased and/or relative movements within the substrate table 6 are damped. With the stiffener of an embodiment of the present invention it may be possible to increase the stiffness of a substrate table 6 substantially, for instance with a factor four to eight.

Generally, the control action is aimed at reducing the flexibility of the substrate table 6 and therewith resulting internal deformations, by increasing the stiffness and/or damping of relative movements within the substrate table 6. In particular, the transfer function of force to displacement other than rigid body movements should be minimized.

To increase the sensitivity of the measurements made, the measurement signals of the first sensor 20 and the second sensor 21 may be compared. For instance, when the ends 23, 24 of the substrate table 6 are bend upwards, the length of the upper side of the plate-shaped substrate table 6 becomes smaller, while the length of the lower side becomes longer. As a result, the change between the two measurement signals of the sensors 20 and 21 is larger than the change of each the measurement signals itself. Therefore, in particular to measure bend modes or torque modes of the substrate table 6, it is beneficial to use sensors 20, 21 arranged close to the upper and lower surface of the plate-shaped substrate table 6, and to preferably combine measurement signals of sensors close to the upper and lower surface to further increase the sensitivity of the measurements.

In the embodiment shown in FIG. 3, only two sensors 20, 21 are shown. In practice, multiple sensors may be used to measure internal deformations of the substrate table 6, i.e. relative movements within the substrate table 6, as now will be explained.

Figure 4:
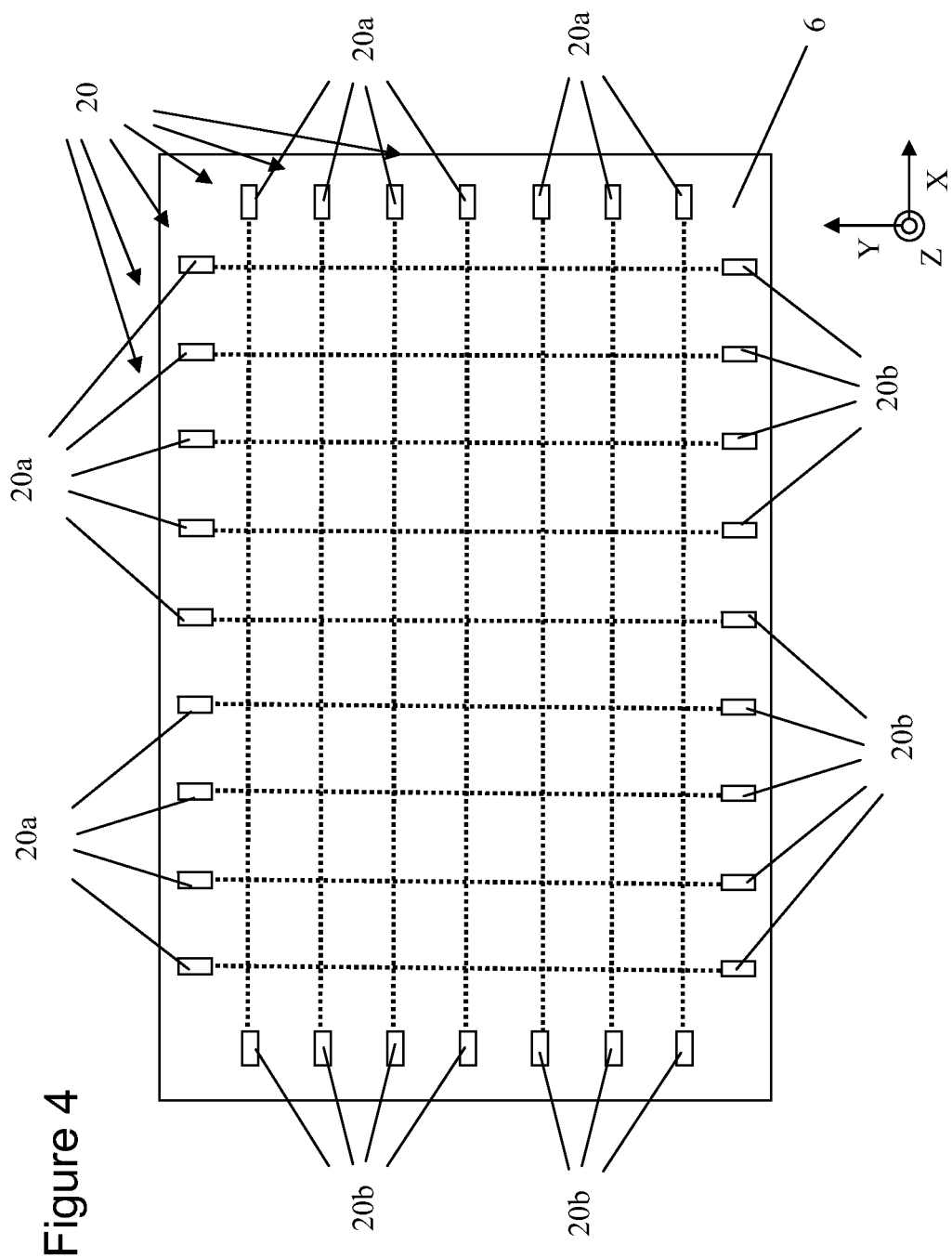
FIG. 4 depicts a top view of the substrate table of FIG. 3.

FIG. 4 shows a top view of a substrate table 6 wherein multiple sensors 20, are arranged, each sensor 20 having a source and detector unit 20a and a mirror unit 20b. These sensors 20 provide a web of measurement lines over the surface of the substrate table 6. By measurement of the change of distance in any of the sensors 20, an internal deformation may be determined and used to counteract the internal deformation by the actuators 22. By providing sensors 20 over the surface over the substrate table 6 information regarding internal deformation at any location on the substrate table may be obtained. A similar web of sensors 21 may be provided near the bottom side of the substrate table 6.

The sensor parts 20a, 20b are arranged near the edges of the substrate table 6 so that the measurement beams travel over a relative long path. Therewith, the sensors 20 are sensitive to relative small shape changes of the substrate table 6. The sensors 20 may be able to measure with a resolution of better than about 10 nanometers, or even better than about 1 nanometer over a distance of 200 mm.

The information of the sensors 20 may for instance be used in the controller 14 to determine which deformation modes, the substrate table 6 is subject to, for instance, a torque and/or bend mode. These deformation modes may be useful to calculate in the controller 14 the actuation forces to be exerted by the actuators 22 to counteract the internal deformation.

In alternative embodiments, the sensors 20 may be divided in any suitable way over the substrate table 6 for measuring changes in distance between different parts of the substrate table 6. For instance, the sensors 20 may only be provided along the edges of the substrate table to determine particular bending modes of the substrate table 6. In general it is beneficial to know specific dominant bending modes of the substrate table 6 and arrange the sensors 20 in such a way that the sensors are sensitive to these bending modes. The sensors may also be arranged at different heights in the substrate table 6 and the measurement beams may be provided at different angles than the X and Y directions shown in FIG. 4. For instance, diagonal measurement paths may be very suitable for determining torsion modes.

Figure 5:
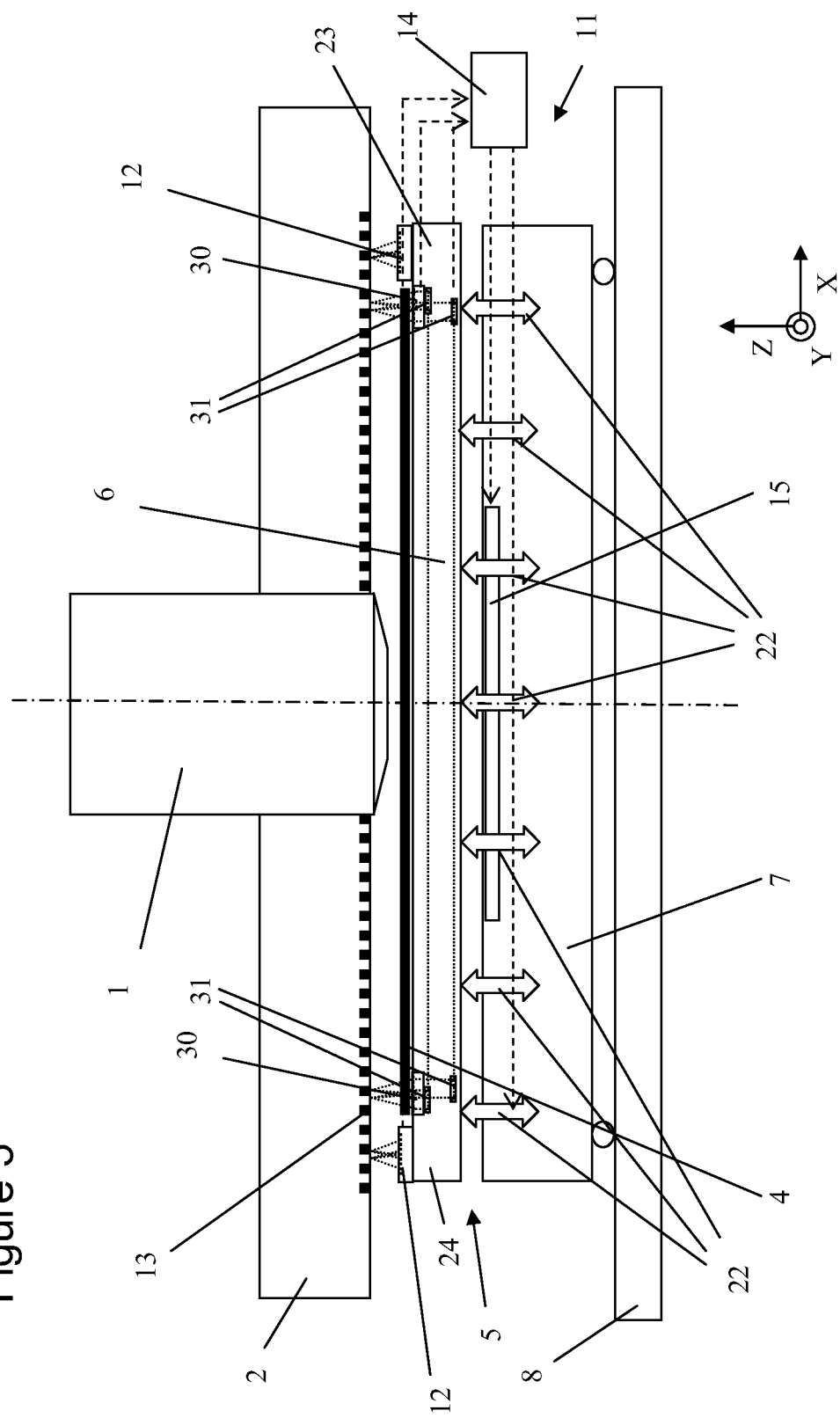
FIG. 5 depicts a positioning system for a substrate table according to an embodiment of the invention.

FIG. 5 shows an alternative embodiment of a positioning system including a stiffener configured to stiffen the plate shaped substrate table 6. In the embodiment of FIG. 5, a sensor structure similar to encoder heads 12 is used in order to determine internal deformations within the substrate table 6. Other parts of the stiffener, such as controller and actuators are substantially the same as in the embodiment of FIG. 3 and will not be further elucidated here.

The sensor structure includes sensor heads 30 (only two shown) arranged at opposed ends 23, 24 of the substrate table 6. The sensor heads 30 are arranged at the upper surface of the substrate table 6, and may be divided over the circumference of the substrate table 6, i.e. divided over the top surface of the substrate table 6 not covered by the substrate 4. Each of the sensor heads 30 includes a laser source which provides a laser beam which is reflected by the grid or grating 3 back to the sensor head 30. However, different than the encoder heads 12, the measurement beam not only runs between the sensor head 12 and the grid or grating 13 and back, but via optical elements 31, the measurement beam also runs through the substrate table 6. Any change in length in this measurement path may now be determined. Thus, both changes in the distance between the substrate table 6 and the grid or grating 13 but also changes of distances between the ends 23 and 24 may be determined by the sensor structure of the embodiment of FIG. 5.

In this measurement signal the changes in distance between sensor head 12 and grid or grating 13 due to rigid body movement should not be taken into account to determine internal deformation. For this reason, the sensor structure can be made independent of these movements or the rigid body movements can be subtracted from the measurement signals. The measurement signals independent of the rigid body movements are representative for the internal deformation of the substrate table 6 and can be used as input for the controller 14 in order to provide actuation signals for the actuators 22.

It is remarked that in practice a multi dimensional control strategy may be used for control of both the rigid-body mode and the internal deformation modes. Therefore, only one controller 14 is depicted for the control of both modes. Also sensors and actuators may be used for both rigid body mode and internal deformation modes.

On the basis of the actuation signals, the actuators 22 exert forces on the substrate table 6 to counteract the internal deformations of the substrate table 6. As a result, the stiffness of the substrate table 6 is substantially improved and/or the relative movements of parts within the substrate table 6 are decreased.

A benefit of using a sensor structure having a measurement beam which also measures over the distance between the sensor head 30 and the grid or grating 3 in the z-direction is that measurements in this Z-direction are sensitive for specific mode shapes of the substrate table 6, in particular bending and torques of the substrate table 6. These bending and torsion modes are dominant in known substrate table layouts, and therefore it is useful to have a sensor structure which is particularly sensitive for these modes.

Other sensor structures using an optical measurement beam which runs both through or along the substrate table in a direction substantially parallel to the main plane, as in a direction substantially perpendicular to the main plane may be applied.

Figure 6:
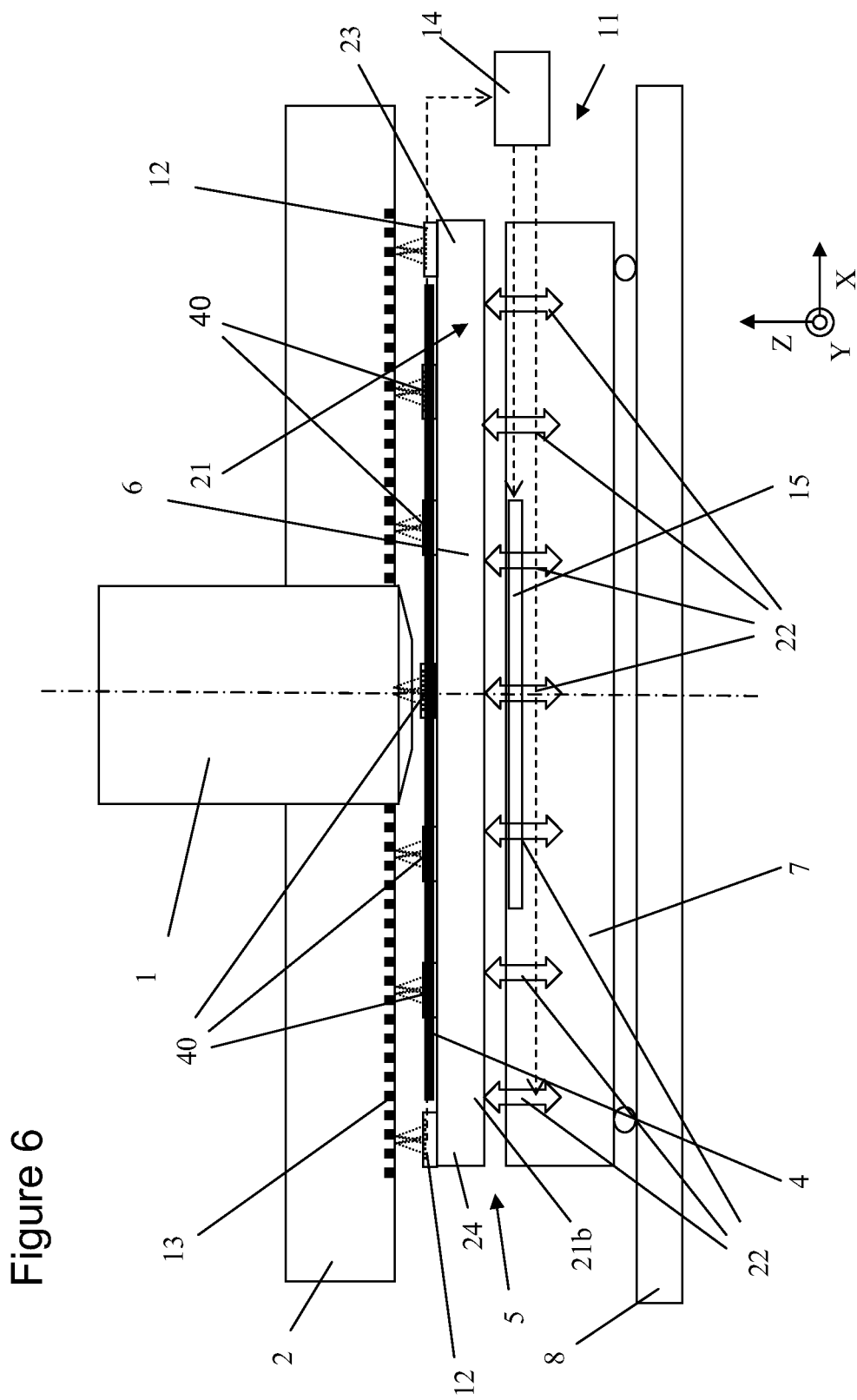
FIG. 6 depicts a positioning system for a substrate table according to an embodiment of the invention.

FIG. 6 shows another alternative embodiment of a positioning system including a stiffener to stiffen the plate shaped substrate table 6. In the embodiment of FIG. 6, sensors 40 are provided to determine internal deformations within the substrate table 6. Other parts of the stiffener, such as controller and actuators are substantially the same as in the embodiment of FIG. 3 and will not be further elucidated here.

The sensors 40 are arranged about the circumference of the substrate table 6, i.e. in the top surface area not covered by the substrate 4. The sensors 40 are configured to measure the distance or change in distance between the substrate support 6 and the grid or grating 13. The sensors 40 may correspond to the sensor heads 12, or may be the any other type of sensor capable of measuring the distance or change in distance between the sensor 40 and the grid or grating 13. It is desirable that the sensors be made insensitive to rigid body movements of the substrate support 6, or rigid body movements may be subtracted from the measured distances.

The resulting changes in distance measured by the sensors 40 are representative of the internal deformation of the substrate table 6, and can be used as input for the controller 14 in order to provide actuation signals for the actuators 22. On the basis of these actuation signals, the actuators 22 exert forces on the substrate table 6 to counteract the internal deformations of the substrate table 6. As a result, the stiffness of the substrate table 6 is substantially improved and/or the relative movements of parts within the substrate table 6 are decreased.

A benefit of the sensor structure of the embodiment of FIG. 6 is that the differential change in distance between different parts of the substrate table 6 and the grid or grating 13 provides reliable information on the internal deformations in the substrate table 6. Furthermore, no separate reference object has to be provided, as the grid or grating 13 is already provided for the measurement of rigid body movement measured by sensor heads 12.

Figure 7:
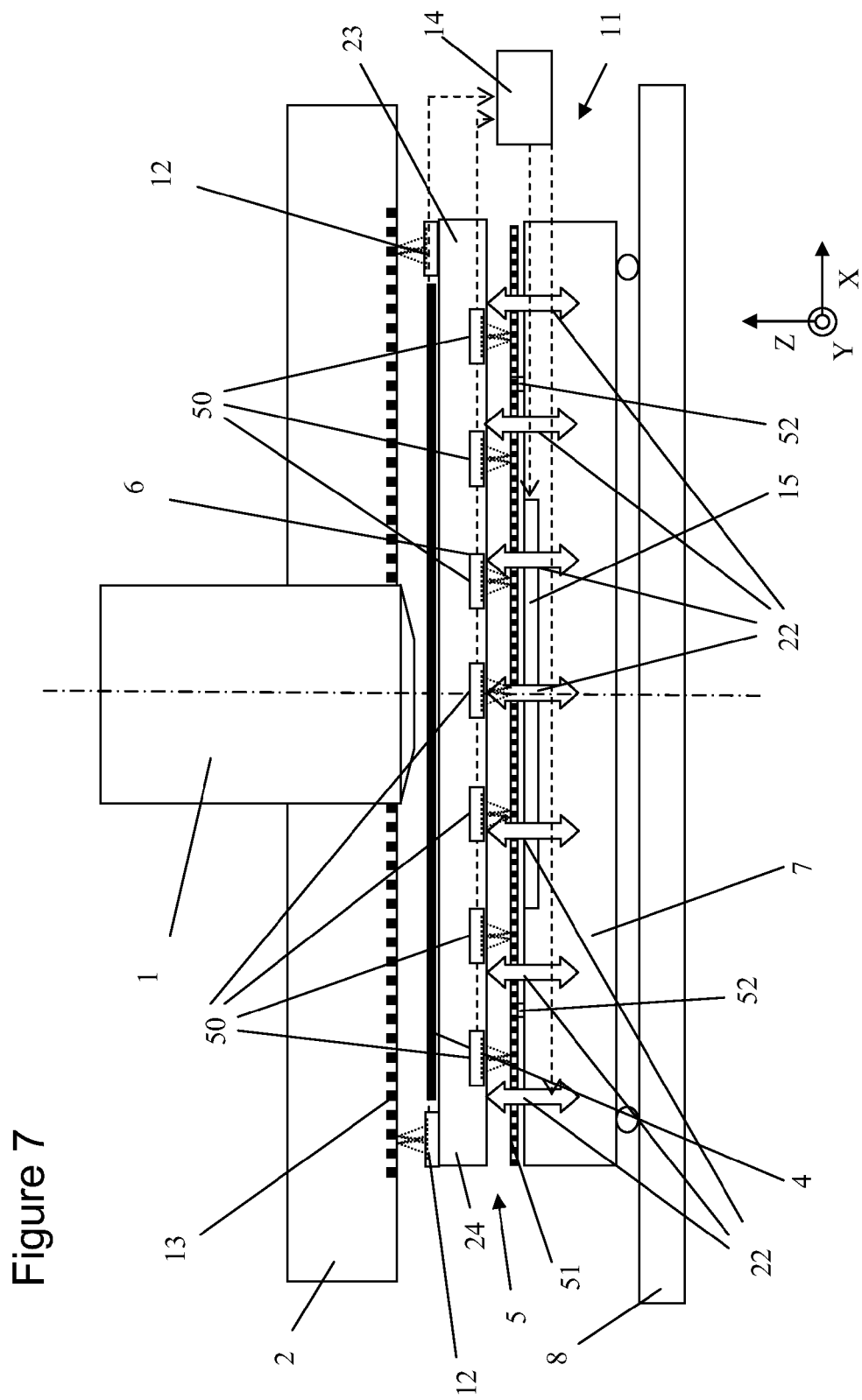
FIG. 7 depicts a positioning system for a substrate table according to an embodiment of the invention.

FIG. 7 shows yet another alternative embodiment of a sensor structure to be used in a positioning system including a stiffener to stiffen the plate shaped substrate table 6. Unless described otherwise, the positioning system of FIG. 7 may be carried out the same as in the embodiments of FIGS. 3-6.

The sensor structure of FIG. 7 includes sensors 50 arranged at the bottom side of the substrate table 6. The sensors 50 are configured to measure a distance or change in distance with respect to a grid plate 51. The grid plate 51 is arranged at the top side of the substrate table support 7 via a kinematic coupling point 52 therewith avoiding or at least decreasing the effect of accelerations and/or vibrations on the position of the grid plate 51. In an alternative embodiment, complete decoupling is provided through force actuators similar to substrate table actuation, or a passive or active damping system may be provided between the substrate table support 7 and the grid plate 51.

The sensors 50 may be suitably divided over the surface of the bottom side of the substrate table support 7 to recognize internal deformations of the substrate table 6. The sensors 50 may be placed next to the outer circumference of the substrate table 6, but also on other locations.

In the shown embodiment, the grid plate 51 covers the whole area of the substrate table 6. However, since the range of movement of this substrate table support 7 is small with respect to the substrate table 6, only a small grid on the grid plate 51 can cover the whole range of movement of the sensors 50 with respect to the grid plate 51. It is remarked that, as an alternative for one grid plate 51 for all sensors 50 as shown in FIG. 7, a relative small grid plate for a limited number of sensors 50, or even one sensor 50 may be provided. In practice such smaller grid plates may be useful since there may also be space required for other components between the substrate table 6 and the substrate table support 7, such as the actuator 15.

The sensors 50 may correspond to the sensor heads 12, or may be any other type of sensor capable of measuring the distance or change in distance between the sensor 50 and the grid or grating 51. Also in this embodiment, the sensor signals may be made insensitive to rigid body movements of the substrate support 6, for instance by the build-up of the sensors 50 or by subtracting rigid body movements of the measured signals.

The resulting changes in distance measured by the sensors 50 are representative of the internal deformations of the substrate table 6, and can be used as input for the controller 14 in order to provide actuation signals for the actuators 22. On the basis of these actuation signals, the actuators 22 exert forces on the substrate table 6 to counteract the internal deformations of the substrate table 6. As a result, the stiffness of the substrate table 6 is substantially improved and/or the relative movements of parts within the substrate table 6 are decreased.

A benefit of the embodiment of FIG. 7 is that the reference object, in the form of grid plate 51 may be attached to the substrate table support 7. Since the range of movement of this substrate table support 7 is small with respect to the substrate table 6, only a small grid plate can cover the whole range of movement of the sensors 50 with respect to the grid plate 51. Furthermore, the space available at the bottom side of the substrate table 6 is not limited by the presence of the projection system or the substrate 4. Thus, the sensors 50 may also be arranged below the substrate 4. A benefit of this is that the internal deformation at the location of the target portion of the substrate 4, i.e. the part of the wafer on which a patterned beam is projected, may be determined with higher accuracy.

Instead of an optical measurement system using the grid plate 51, also any other suitable system, preferably optical measurement system, may be used to measure the distance or change in distance between the substrate table 6 and the substrate table support 7 may be used. Preferably, the reference object, such as grid plate 51 is made insensitive to accelerations and/or vibrations of the substrate table support 7 by kinematic couplings, force actuators, or active damping systems or dampers or any other suitable system.

Hereinabove, a stiffener has been described which is applied in a positioning system of a plate shaped object. Since the stiffener is applied in a plate-shaped object, the stiffener is configured to provide an active stiffening in a layer substantially parallel to the main plane of the object. It is also contemplated that the stiffener may be applied in objects having another shape, for instance box-type structures. Also, the stiffener may be applied for objects in which internal deformations in multiple directions have to be counteracted. In these applications the stiffener may be configured to counteract internal deformations, wherein sensors and actuators are arranged in multiple directions.

Furthermore, it is remarked that the stiffener according to an embodiment of the invention may be used to counteract internal deformation during accelerations or decelerations, but also to counteract internal deformations due to other causes, such as temperature differences between different parts of the substrate table or external forces exerted on the substrate table, for instance forces exerted by an immersion system of the lithographic apparatus.

In one embodiment, actuator 15 may actuated at a different frequencies than actuator 22. For example, actuator 15 may actuate at a lower frequency than actuator 22. The lower frequency may correspond to the frequency range of the kinematic actuation of the substrate table 6. This way, it is possible to reduce undesired deformations of the substrate table 6 caused by drift in the actuator 22. The drift may also be caused in an amplifier or a current sensor connected to the actuator 22.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

In an embodiment there is provided a positioning system configured to position a movable object having a body. The positioning system comprises an object position sensor, an object actuator and an object controller. The object position sensor is configured to measure a position quantity of the object. The object actuator is configured to exert an actuation force on the object. The object controller is configured to provide an object actuation signal for the actuator on the basis of a difference between a desired position quantity and the measured position quantity. The positioning system further comprises a stiffener configured to increase the stiffness and/or to damp a relative movement within the body of the object. The stiffener comprises a sensor, an actuator and a controller. The sensor is configured to determine a measurement signal representative of an internal strain or relative displacement in the body. The actuator is configured to exert an actuation force on a part of the body. The controller is configured to provide, on the basis of the measurement signal of the sensor, an actuation signal to the actuator to increase the stiffness and/or to damp the movement within the body.

The sensor may be configured to measure the measurement signal within the body. The sensor may be configured to measure a distance or a change in distance between a part of the body and a reference object. The reference object may be a part of the object position sensor. The reference object may be mounted on the movable object, and the reference object may not be rigidly coupled to the body.

The sensor may be configured to measure a change in distance between two parts in the body, and the controller may be configured to provide the actuation signal to the actuator to maintain the change in distance at a substantially zero-level.

The sensor may be an optical sensor configured to measure a change in distance between two parts of the body. The optical sensor may use laser interferometry.

The body may comprise a light transparent element, and a measurement beam of the optical sensor may propagate mainly through the light transparent element.

The body may have a plate shape having a main plane, and the stiffener may be configured to increase the stiffness of the body in the main plane.

The positioning system may comprise a plurality of sensors configured to determine a measurement signal representative of an internal strain or relative displacement in the body. Each of the sensors may be arranged to measure a length between two different parts of the body, so that the sensors provide a web of measurement lines spread over the body.

The positioning system may comprise a plurality of sensors configured to determine a measurement signal representative of an internal strain or relative displacement in the body. The body may have a plate shape having a main plane. A first main surface may be at a first side of the body, and a second main surface at the opposite side of the body. A first sensor of the plurality of sensors may be configured to measure a first distance between parts of the body close to the first main surface and a second sensor of the plurality of sensors may be configured to measure a second distance between the parts close to the second main surface. The controller may provide an actuation signal on the basis of a change in a difference between the first and the second measured distance.

The sensor may be configured to measure a change in distance between two parts of the body in combination with a change in distance of the object with respect to another object.

In an embodiment there is provided a lithographic apparatus comprising a patterning device, a substrate support, a projection system and a positioning system. The patterning device support is constructed to support a patterning device. The patterning device is capable of imparting a radiation beam with a pattern in its cross-section to form a patterned radiation beam. The substrate support is constructed to hold a substrate. The projection system is configured to project the patterned radiation beam onto a target portion of the substrate. The positioning system is configured to control a position of one of the supports, said one support having a body. The positioning system comprises a support position sensor, a support actuator and a support controller. The support position sensor is configured to measure a position quantity of the body of said one support. The support actuator is configured to exert an actuation force on the body of said one support. The support controller is configured to provide an actuation signal for the actuator on the basis of a difference between a desired position quantity and the measured position quantity. The position system further comprises a stiffener configured to increase the stiffness and/or to damp a relative movement within the body of the object. The stiffener comprises a sensor, an actuator and a controller. The sensor is configured to determine a measurement signal representative of an internal strain or relative displacement in the body. The actuator is configured to exert an actuation force on a part of the body. And the controller is configured to provide, on the basis of the measurement signal of the sensor, an actuation signal to the actuator to increase the stiffness and/or to damp the movement within the body. The sensor may be configured to measure the measurement signal within the body.

The sensor may be an optical sensor that is configured to measure a change in distance between two parts of the body. The sensor may be configured to measure a distance or a change in distance between a part of the body and a reference object. The reference object may be mounted on a metro-frame or a long stroke part of the support or substrate table.

In an embodiment there is provide a method for reducing flexibility and internal deformations by increasing stiffness and/or a damping movement within a body of an object using a stiffener. The stiffener comprises a sensor, an actuator and a controller. The sensor is configured to measure a measurement signal representative of an internal strain or relative displacement in the body. The actuator is configured to exert an actuation force on a part of the body. The controller is configured to provide, on the basis of the measurement signal of the sensor, an actuation signal to the actuator to increase the stiffness and/or to damp the movement within the body. The method further comprises measuring with the sensor a distance between two parts of the body to obtain the measurement signal; and providing the actuation signal to the actuator to exert the force on the part of the body so as to maintain substantially a same distance between the two parts of the body.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A positioning system configured to position a movable object having a body, the positioning system comprising:
    an object position sensor configured to measure a position quantity of the object;
    an object actuator configured to exert an actuation force on the object;
    an object controller configured to provide an object actuation signal for the actuator on the basis of a difference between a desired position quantity and the measured position quantity; and
    a stiffener configured to increase the stiffness and/or to damp a relative movement within the body of the object, the stiffener comprising
        an optical sensor configured to determine a measurement signal representative of an internal strain or relative displacement in the body, the optical sensor configured to measure a change in distance between two parts of the body, said body being transparent to radiation emitted by the optical sensor to allow said radiation to travel between the two parts,
        an actuator configured to exert an actuation force on a part of the body, and
        a controller configured to provide, on the basis of the measurement signal of the sensor, an actuation signal to the actuator to increase the stiffness and/or to damp the movement within the body.

2. The positioning system of claim 1, wherein the sensor is configured to measure the measurement signal within the body.

3. The positioning system of claim 1, wherein the controller is configured to provide the actuation signal to the actuator to maintain the change in distance at a substantially zero-level.

4. The positioning system of claim 1, wherein the optical sensor uses laser interferometry.

5. The positioning system of claim 1, wherein the body has a plate shape having a main plane, wherein the stiffener is configured to increase the stiffness of the body in the main plane.

6. The positioning system of claim 1, wherein the sensor is configured to measure a change in distance between two parts of the body in combination with a change in distance of the object with respect to another object.

7. A positioning system configured to position a movable object having a body, the positioning system comprising:
    an object position sensor configured to measure a position quantity of the object;
    an object actuator configured to exert an actuation force on the object;
    an object controller configured to provide an object actuation signal for the actuator on the basis of a difference between a desired position quantity and the measured position quantity; and
    a stiffener configured to increase the stiffness and/or to damp a relative movement within the body of the object, the stiffener comprising
        a sensor configured to determine a measurement signal representative of an internal strain or relative displacement in the body,
        an actuator configured to exert an actuation force on a part of the body, and
        a controller configured to provide, on the basis of the measurement signal of the sensor, an actuation signal to the actuator to increase the stiffness and/or to damp the movement within the body,
    wherein the sensor is configured to measure a distance or a change in distance between a part of the body and a reference object, and
    wherein the reference object is mounted on the movable object, and the reference object is not rigidly coupled to the body.

8. The positioning system of claim 7, wherein the reference object is a part of the object position sensor.

9. A positioning system configured to position a movable object having a body, the positioning system comprising:
    an object position sensor configured to measure a position quantity of the object;
    an object actuator configured to exert an actuation force on the object;
    an object controller configured to provide an object actuation signal for the actuator on the basis of a difference between a desired position quantity and the measured position quantity; and
    a stiffener configured to increase the stiffness and/or to damp a relative movement within the body of the object, the stiffener comprising
        a plurality of sensors configured to determine a measurement signal representative of an internal strain or relative displacement in the body,
        an actuator configured to exert an actuation force on a part of the body, and
        a controller configured to provide, on the basis of the measurement signal of the sensor, an actuation signal to the actuator to increase the stiffness and/or to damp the movement within the body,
    wherein each of the sensors is arranged to measure a length between two different parts of the body, so that the sensors provide a web of measurement lines spread over the body.

10. A positioning system configured to position a movable object having a body, the positioning system comprising:
    an object position sensor configured to measure a position quantity of the object;
    an object actuator configured to exert an actuation force on the object;

an object controller configured to provide an object actuation signal for the actuator on the basis of a difference between a desired position quantity and the measured position quantity; and a stiffener configured to increase the stiffness and/or to damp a relative movement within the body of the object, the stiffener comprising a plurality of sensors configured to determine a measurement signal representative of an internal strain or relative displacement in the body, an actuator configured to exert an actuation force on a part of the body, and a controller configured to provide, on the basis of the measurement signal of the sensor, an actuation signal to the actuator to increase the stiffness and/or to damp the movement within the body, wherein the body has a plate shape having a main plane, a first main surface at a first side of the body, and a second main surface at the opposite side of the body, wherein a first sensor of the plurality of sensors is configured to measure a first distance between parts of the body close to the first main surface and a second sensor of the plurality of sensors is configured to measure a second distance between the parts close to the second main surface, wherein the controller provides an actuation signal on the basis of a change in a difference between the first and the second measured distance.

11. A lithographic apparatus comprising:

a patterning device support constructed to support a patterning device, the patterning device being capable of imparting a radiation beam with a pattern in its cross-section to form a patterned radiation beam;

a substrate support constructed to hold a substrate;

a projection system configured to project the patterned radiation beam onto a target portion of the substrate; and a positioning system configured to control a position of one of the supports, said one support having a body, the positioning system comprising a support position sensor configured to measure a position quantity of the body of said one support, a support actuator configured to exert an actuation force on the body of said one support, a support controller configured to provide an actuation signal for the actuator on the basis of a difference between a desired position quantity and the measured position quantity, and a stiffener configured to increase the stiffness and/or to damp a relative movement within the body of the object, the stiffener comprising an optical sensor configured to determine a measurement signal representative of an internal strain or relative displacement in the body, the optical sensor configured to measure a change in distance between two parts of the body, said body being transparent to radiation emitted by the optical sensor to allow said radiation to travel between the two parts, an actuator configured to exert an actuation force on a part of the body, and a controller configured to provide, on the basis of the measurement signal of the sensor, an actuation signal to the actuator to increase the stiffness and/or to damp the movement within the body.

12. The lithographic apparatus of claim 11, wherein the sensor is configured to measure the measurement signal within the body.

13. The lithographic apparatus of claim 11, wherein the sensor is an optical sensor that is configured to measure a change in distance between two parts of the body.

14. The lithographic apparatus of claim 11, wherein the sensor is configured to measure a distance or a change in distance between a part of the body and a reference object.

15. The lithographic apparatus of claim 14, wherein the reference object is mounted on a metro-frame or a long stroke part of the support or substrate table.

16. A method for reducing flexibility and internal deformations by increasing stiffness and/or damping movement within a body of an object using a stiffener that comprises an optical sensor configured to measure a measurement signal representative of an internal strain or relative displacement in the body, an actuator configured to exert an actuation force on a part of the body, and a controller configured to provide, on the basis of the measurement signal of the sensor, an actuation signal to the actuator to increase the stiffness and/or to damp the movement within the body, the method comprising:

measuring with the sensor a distance between two parts of the body to obtain the measurement signal; and providing the actuation signal to the actuator to exert the force on the part of the body so as to maintain substantially a same distance between the two parts of the body, wherein the optical sensor is configured to measure a change in distance between two parts of the body, said body being transparent to radiation emitted by the optical sensor to allow said radiation to travel between the two parts.

* * * * *